United States Patent [19]

Kashiwagi

[11] Patent Number: 4,801,852
[45] Date of Patent: Jan. 31, 1989

[54] CRT HORIZONTAL DEFLECTION CIRCUIT ENABLING HORIZONTAL SWEEP WIDTH ADJUSTMENT WITH STABILIZED EHT OUTPUT

[75] Inventor: Shigeru Kashiwagi, Noda, Japan

[73] Assignee: Victor Company of Japan, Ltd., Japan

[21] Appl. No.: 921,766

[22] Filed: Oct. 22, 1986

[30] Foreign Application Priority Data

Oct. 22, 1985 [JP] Japan .................................. 60-235844

[51] Int. Cl.[4] .......................... H01J 29/70; H01J 29/76
[52] U.S. Cl. ..................................... 315/400; 315/411; 358/243
[58] Field of Search .................... 315/411, 400, 408; 358/190, 243

[56] References Cited

U.S. PATENT DOCUMENTS

3,970,780  7/1976  Minoura .............................. 315/411
4,209,731  6/1980  Miko et al. ......................... 315/400

Primary Examiner—Theodore M. Blum
Attorney, Agent, or Firm—Lowe, Price, LeBlanc, Becker & Shur

[57] ABSTRACT

A horizontal deflection circuit for performing horizontal sweep operation of a CRT includes a saturable reactor having controlled windings connected through the primary winding of a flyback transformer to the CRT horizontal deflection coil, to supply deflection current thereto from a voltage supply produced from a voltage control circuit. The level of this supply voltage is controlled by feedback operation in accordance with the amplitude of pulses produced from an output winding of the flyback transformer such as to maintain this pulse amplitude at a fixed value, and hence maintain an EHT voltage derived from pulses from a secondary winding of the transformer at a fixed value. These fixed values are held constant when a DC current passed through the reactor control winding is varied to adjust the inductance of the controlled windings, and thereby adjust the horizontal sweep width produced on the CRT screen.

11 Claims, 3 Drawing Sheets

CRT HORIZONTAL DEFLECTION CIRCUIT ENABLING HORIZONTAL SWEEP WIDTH ADJUSTMENT WITH STABILIZED EHT OUTPUT

BACKGROUND OF THE INVENTION

The present invention relates to a horizontal deflection circuit for a CRT (cathode ray tube), used for example in a television receiver, which enables the horizontal sweep width of CRT scanning to be freely adjusted.

Figure 1:
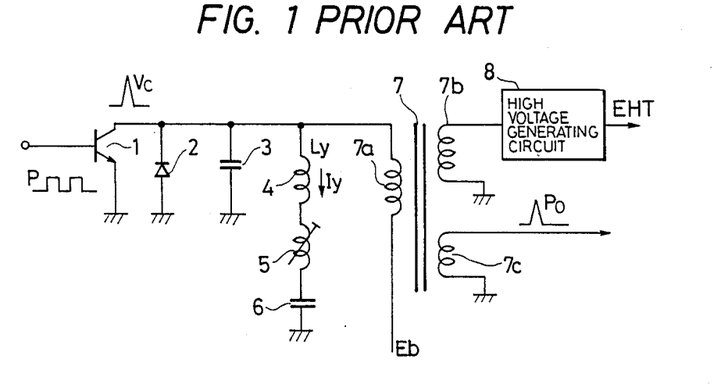
FIGS. 1 and 2 respectively show prior art examples of horizontal deflection circuits.

FIG. 1 shows a circuit diagram of an example of such a prior art horizontal deflection circuit, having a configuration whereby adjustment can be performed of the level of horizontal deflection current which flows in a horizontal deflection coil of the CRT. In the following description of prior art examples and of embodiments of the present invention, it will be assumed for convenience of description that the horizontal deflection circuit is utilized in a television receiver, however it should be understood that the present invention is equally applicable to various other types of apparatus which employ raster scanning of a CRT.

Reference numeral 1 denotes a horizontal output transistor which receives excitation pulses P from a preceding circuit stage (not shown in the drawings), to be periodically switched between a conducting and a non-conducting state. The first half of the saw-tooth wave scanning current is mainly supplied from a damper diode 2. Numeral 3 denotes a flyback resonance capacitor, numeral 4 a horizontal deflection coil which is connected at one end thereof to the collector of horizontal output transistor 1, numeral 5 a sweep width adjustment coil which is connected at one end thereof to the other end of the horizontal deflection coil 4, and numeral 6 an S-curve correction capacitor which is connected between ground potential and the other end of sweep width adjustment coil 5. A flyback transformer 7 is provided with a primary winding 7a, a secondary winding 7b, and a tertiary winding 7c. A DC potential $E_b$ of a power source for the horizontal deflection circuit is applied to one end of the primary winding 7a of flyback transformer 7, while the other end of primary winding 7a is connected to junction of the collector of horizontal output transistor 1 and horizontal deflection coil 4. The switching operation of output transistor 1 results in flyback pulses being produced across the primary winding 7a of flyback transformer 7. The secondary winding 7b of flyback transformer 7 performs voltage step-up of these flyback pulses, and the stepped-up pulses are applied to a high-voltage DC generating circuit 8 (i.e. a high-voltage rectifier circuit) for generating an EHT voltage to be applied to the anode of the CRT. In addition, pulses designated in FIG. 1 as $P_o$ are produced from the tertiary winding 7c of flyback transformer 7. These may be reflected and smoothed to provide a DC power source for other circuits of the television receiver.

The operation of a horizontal deflection circuit of the form shown in FIG. 1 is well known, and the circuit produces a current flow (designated in the following as $I_y$) having a sawtooth waveform in the horizontal deflection coil 4, to thereby execute horizontal sweep deflection of the electron beam of the CRT. The peak-to-peak value of this sawtooth waveform current $I_y$ is given as follows, designating the power supply voltage applied to the horizontal deflection circuit as $E_b$, the horizintal scanning period as $T_s$, the impedance of the horizontal deflection coil 4 as $L_y$, the impedance of the sweep width adjustment coil 5 as $L_a$:

$$I_y = E_b \cdot T_s / (L_y + L_a) \tag{1}$$

Figure 2:
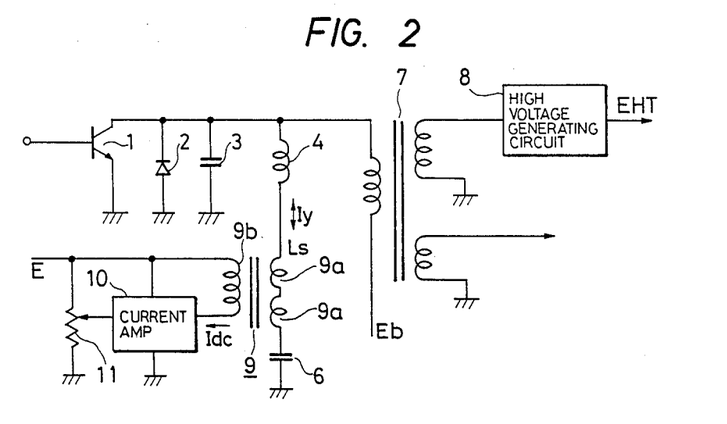

If the impedance $L_a$ of the sweep width adjustment coil 5 is increased then the amplitude of the sawtooth waveform current $I_y$ which flows in the horizontal deflection coil 4 will be reduced, and conversely a reduction of the impedance $L_a$ will produce an increase in the amplitude of current $I_y$. In this way, the amplitude of the sawtooth waveform current $I_y$, and hence the horizontal sweep width of the CRT raster, can be adjusted as required by varying the impedance of the sweep width adjustment coil. This impedance will be designated in the following as $L_a$. With the circuit arrangement shown in FIG. 1, adjustment of the horizontal sweep width is performed by direct variation of impedance $L_a$ of the sweep width adjustment coil 5. However it is also possible to perform such adjustment by utilizing a saturable reactor. An example of this is shown in FIG. 2. Instead of the sweep width adjustment coil 5 used in the circuit of FIG. 1, the controlled windings 9a, 9a' of a saturable reactor 9 are connected in series with the horizontal deflection coil 4. A source of a current Idc is connected to the control winding 9b of saturable reactor 9, and the value of this current Idc is varied to thereby alter the inductance of controlled windings 9a and 9a'.

In the example of FIG. 2, the source of current Idc is an amplifier 10, which produces an output current that is determined by an input voltage applied to amplifier 10 from the slider of a potentiometer 11. The potentiometer 11, amplifier 10 and primary winding 9b are respectively coupled to a source of a supply voltage E. In this way, the level of current Idc which flows in the control winding 9b can be varied by adjustment of the potentiometer 11, whereby the inductance of the controlled windings 9a and 9a' of saturable reactor 9 can be adjusted.

Figure 3:
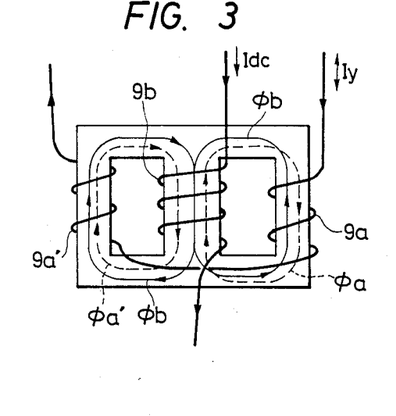
FIG. 3 is a plan view of an example of a saturable reactor.

The saturable reactor 9 can have, for example, the configuration shown in FIG. 3. Each of the arms of the reactor is formed of an E-E type core or an E-I type of core. The controlled windings 9a and 9a' are respectively wound on the two side arms of the reactor core in the directions shown in FIG. 3, while the control winding 9b is wound around the central arm of the core. When a DC current Idc is passed through the control winding 9b then a corresponding magnetic flux $\phi b$ is produced, and when a current $I_y$ is passed through the controlled windings 9a and 9a' (i.e. around the two side arms of the saturable reactor), magnetic fluxes $\phi a$ and $\phi a'$ will be respectively produced in these side arms. The direction of the magnetic flux $\phi b$ will be identical to that of one of the fluxes $\phi a$ or $\phi a'$. As a result, if the levels of current flow are sufficiently high, the one of the two side arms in which this flux direction coincidence occurs will become magnetically saturated, so that the sum of the inductance values of the ontrolled windings 9a and 9a' (designated in the following as $L_s$) will be reduced. Thus, the value of $L_s$ can be varied as required, by varying the level of DC current Idc which flows in the control winding.

Figure 4:
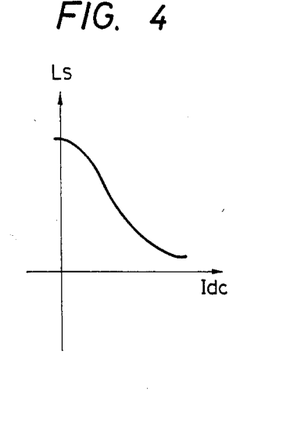
FIGS. 4 is a graph illustrating a relationship between control winding current level and controlled winding inductance, for a saturable reactor.

FIG. 4 illustrates the relationship between variation of DC current Idc and the inductance value $L_s$. As is clear from FIG. 4, as the level of Idc is increased, the value of $L_s$ is reduced. With the circuit shown in FIG.

2, the horizontal deflection current $I_y$ which flows in horizontal deflection coil 4 (connected in series with controlled windings 9a and 9a' of saturable reactor 9) will be increased by such a reduction of inductance value $L_s$, and the horizontal sweep width will thereby be increased. Similarly, the horizontal sweep width can be reduced as required, by reducing the level of Idc, to thereby increase the value of inductance $L_s$.

Figure 5:
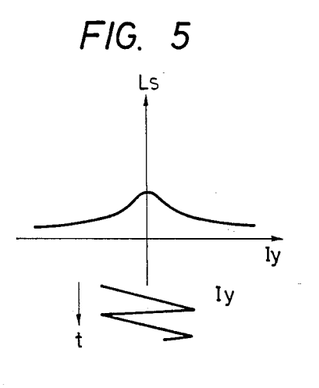
FIG. 5 is a graph illustrating a variation of inductance of controlled windings of a saturable reactor with respect to variation of current passed through these windings.
Figure 6:
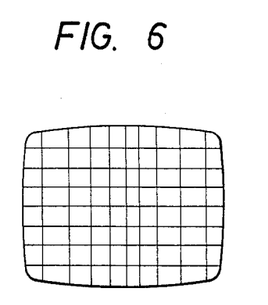
FIG. 6 is a diagram illustrating distortion of a CRT display resulting from an effect shown in FIG. 5.

However certain disadvantages arise with the use of such a saturable reactor for adjustment of horizontal sweep width. The inductance value $L_s$, which is the sum of the inductance values of controlled windings 9a and 9a' of the saturable reactor 9, is affected by the amplitude of the horizontal deflection current $I_y$ which flows through these controlled windings 9a and 9a'. Thus as shown in FIG. 5, the inductance value $L_s$ is increased when the horizontal deflection current $I_y$ is close to zero (i.e. in the region of the center of the horizontal scanning range), and decrease as $I_y$ increases. As a result, for example if a video signal representing a lattice is to be displayed on the CRT, then the distance between successive lines of the lattice will be reduced, within that part of the display which is situated close to the center of the CRT screen. This effect is illustrated in FIG. 6. It can thus be understood that with this prior art circuit, it is not possible to attain satisfactory adjustment of the horizontal sweep width.

Furthermore, with the horizontal deflection circuits shown in FIGS. 1 and 2 respectively, switching operation is performed in response to the supply of excitation pulses P, whereby pulses $P_c$ having a substantially sinusoidal waveform are produced at the collector of the horizontal output transistor 1. In the case of the circuit arrangement of FIG. 1, if the value of the capacitance of the flyback resonance capacitor 3 is designated as C, and the sum of the inductance of the flyback transformer 7 as seen from the primary winding 7a, the inductance of the horizontal deflection coil 4, and the inductance of the sweep width adjustment coil is designated as L, then the peak value of the pulses $P_c$ is expressed by equation (2) given below. Also, in the case of the circuit arrangement of FIG. 2, if the value of the capacitance of the flyback resonance capacitor 3 is designated as C, the sum of the inductance of the flyback transformer 7 as seen from the primary winding 7a, the inductance of the horizontal deflection coil 4, and the sum of the inductance values of the controlled windings 9a and 9a' of saturable reactor 9 is designated as L, then the peak value of the pulses $P_c$ is expressed by equation (2).

$$P_c = E_b \cdot T_s/(2Tr) + E_b \quad (2)$$

In equation (2), Tr denotes the horizontal retrace time. The value of this is given as:

$$= Tr\pi\sqrt{L \cdot C} \quad (3)$$

Thus, with the current of FIG. 1, if for example the inductance value $L_a$ of the sweep width adjustment coil is reduced, (or with the circuit of FIG. 2, if the inductance value $L_s$ which is the sum of the inductances of controlled windings 9a and 9a' of saturable reactor 9 is reduced), then from equation (1) above the value of the sawtooth waveform current $I_y$ which flows through the horizontal deflection coil 4 will be increased. Thus the horizontal sweep width will be accordingly increased. However in addition to this if the inductance $L_a$ of the sweep width adjustment coil 5 is reduced, or if the value of $L_s$ of controlled windings 9a and 9a' is reduced, then from equation (3) above it can be understood that the composite inductance value L will be reduced. Hence, from equation (3), it can be seen that the value of the horizontal retrace time Tr will be reduced, and the amplitude of the collector pulses $P_c$ which are produced at the collector of horizontal output transistor 1 will be increased.

The amplitude of the collector pulses $P_c$ applied to the primary winding 7a of flyback transformer 7 is stepped-up by the secondary winding 7b, and the stepped-up pulses are rectified in high-voltage DC generating circuit 8 to provide the EHT anode voltage for the television receiver CRT. Thus, such an increase in the amplitude of collector pulses $P_c$ will result in a corresponding increase in the amplitude of the stepped-up pulses produced from secondary winding 7b of flyback transformer 7, and hence an increase in the value of the EHT voltage which is applied from circuit 8 to the anode of the CRT.

However, as is well known, an increase in the anode EHT voltage of the CRT will result in a lowering of the deflection efficiency of the CRT. Thus, if adjustment is performed to reduce the horizontal sweep width by adjustment of the inductance of the sweep width adjustment coil 5 in the case of the circuit of FIG. 1, (or by adjustment of the inductance $L_s$ of controlled windings 9a and 9a' of saturable reactor 9 in the case of the circuit of FIG. 2), the effect of this adjustment will be counteracted by a resultant increase in the anode EHT voltage. A similar result will occur when it is attempted to increase the horizontal sweep width by adjustment of the inductance of sweep width adjustment coil 5 (or adjustment of $L_s$ of controlled windings 9a and 9a').

Furthermore, the variation in amplitude of the collector pulses $P_c$ resulting when adjustment is performed of the inductance of the sweep width adjustment coil 5 in the circuit of FIG. 1 (or when the total inductance value $L_s$ of the controlled windings 9a and 9a' is adjusted, in the circuit of FIG. 2) to alter the horizontal sweep width will produce a variation in the amplitude of the pulses $P_o$ which are produced from the tertiary winding 7c of flyback transformer 7. If these pulses $P_o$ are used to produce a supply voltage for other circuits of the television receiver, then problems will result from such variations in the amplitude of the pulses.

SUMMARY OF THE DISCLOSURE

It is an object of the present invention to provide a horizontal deflection circuit for raster scanning of a CRT which enables adjustment of the horizontal sweep width of the CRT to be freely performed, without such adjustment producing a variation of a CRT anode EHT voltage or other supply voltage derived from a secondary or other winding of a flyback transformer.

To achieve this objective, a horizontal deflection circuit according to the present invention includes a saturable reactor having controlled windings thereof connected in series with a primary winding of the flyback transformer, means for varying a DC current flowing in a control winding of the saturable reactor to thereby vary the inductance of the controlled windings, and a voltage control circuit for controlling a level of supply voltage applied to the controlled windings of the saturable reactor and horizontal deflection coil in accordance with an amplitude of voltage pulses produced from an output winding of the flyback transformer.

More specifically, a horizontal deflection circuit according to the present invention comprises:

a horizontal deflection coil, and a periodically actuated switching element coupled thereto;

a flyback transformer having a primary winding, a secondary winding and a tertiary winding, one end of the primary winding being coupled to the horizontal deflection coil;

a saturable reactor having a control winding and a controlled winding, one end of the controlled winding being connected to the other end of the primary winding of the flyback transformer;

voltage control circuit means coupled to the other end of the controlled winding for applying a supply voltage thereto to produce a flow of current through the primary winding and the horizontal deflection coil, the current flow being periodically switched by the switching element, pulses being thereby generated across the primary winding, pulses being thereby generated from the tertiary winding and pulses of stepped-up amplitude being thereby generated from the secondary winding for use in producing an anode voltage of the cathode ray tube;

means for producing a flow of DC current through the control winding of the saturable reactor, said means being operable for adjusting the level of the current flow to thereby vary the inductance of the controlled winding of the saturable reactor, and;

feedback control means for controlling the supply voltage produced from the voltage control circuit means based upon the amplitude of the pulses generated from the tertiary winding, the control being executed such as to maintain the pulse amplitude at a predetermined value.

DESCRIPTION OF THE PREFERRED EMBODIMENTS

Figure 7:
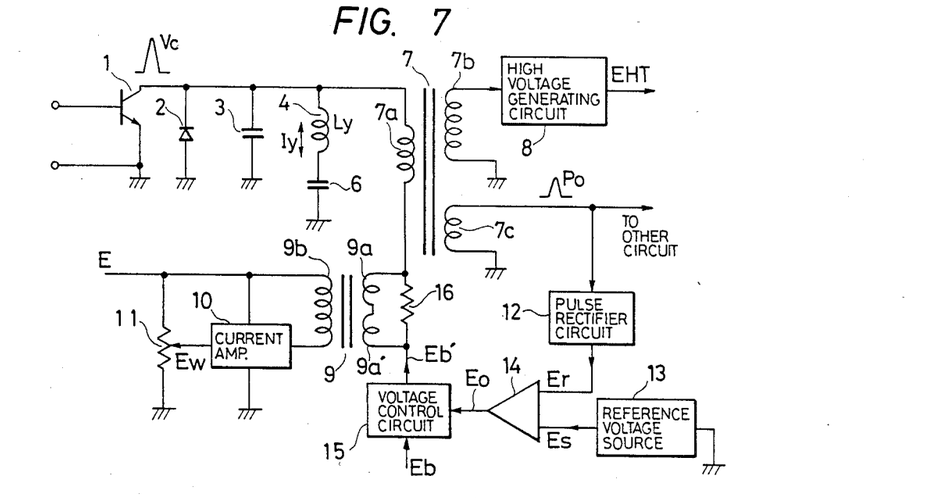
FIG. 7 is a block circuit diagram of an embodiment of a horizontal deflection circuit according to the present invention.
Figure 8:
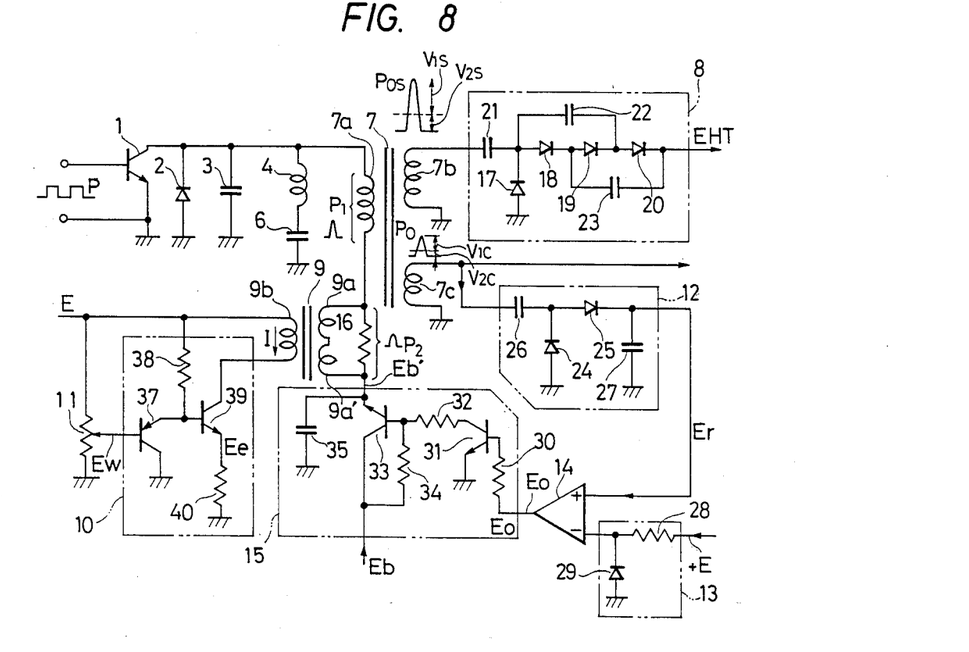
FIG. 8 is a circut diagram of the horizontal deflection circuit embodiment of FIG. 7.

An embodiment of a horizontal deflection circuit according to the present invention will now be described referring to the drawings. FIG. 7 is a block circuit diagram of an embodiment of a horizontal deflection circuit according to the present invention, while FIG. 8 is a circuit diagram showing a specific configuration for the embodiment of FIG. 7. Components in FIGS. 7 and 8 which correspond to components in the prior art examples of FIGS. 1 and 2 described above are indicated by corresponding reference designations.

In FIGS. 7 and 8, as in the prior art examples of FIGS. 1 and 2, a horizontal output transistor 1 receives excitation pulses P from a preceding circuit stage (not shown in the drawings) and is thereby successively switched between conducting and nonconducting states, in conjunction with a damper diode 2. Numeral 3 denotes a flyback resonance capacitor, numeral 4 a horizontal deflection coil, 6 denotes an S-curve correction capacitor, and 7 denotes a flyback transformer. 7a denotes the primary winding, 7b denotes the secondary winding, and 7c denotes a tertiary winding of flyback transformer 7, respectively. One end of the primary winding 7a is connected to the collector of transistor 1, damper diode 2, resonance capacitor 3, and one end of horizontal deflection coil 4, as in the prior art examples described above.

The other end of primary winding 7a of flyback transformer 7 is connected to one end of a circuit consisting of the controlled windings 9a and 9a' of a saturable reactor 9 and a damping resistor 16 connected in parallel with these windings, i.e. to the junction of winding 9a and damping resistor 16, while a voltage control circuit 15 (performing a voltage regulation function as described hereinafter) is connected between the other end of this parallel-connected circuit (i.e. the junction of winding 9a' and damping resistor 16) and a potential $E_b$ of an operating DC power source for the horizontal deflection circuit.

As described for the prior art examples, the secondary winding 7b and tertiary winding 7c of flyback transformer 7 perform voltage step-up of flyback pulses appearing across the primary winding 7a, and the resultant stepped-up pulses are supplied to a high-voltage DC generating circuit 8 which generates an anode EHT voltage for a television receiver CRT. In the case of the specific circuit embodiment shown in FIG. 8, the high-voltage DC generating circuit 8 consists of a modified Cockcroft circuit formed of capacitors 21 to 23 and diodes 17 to 20. With such a configuration for high-voltage DC generating circuit 8, designating the difference between the peak value of the pulses $P_{os}$ produced from the secondary winding 7b of flyback transformer 7 and the average value of pulses $P_{os}$ as $V_{1S}$, and designating the differece between the average value of pulses $P_{os}$ and the pedestal value of these pulses as $V_{2S}$, and designating the output voltage from high-voltage DC generating circuit 8 as $E_{EHT}$, then this voltage is given by the following equation:

$$E_{EHT} = 2V_{1S} + 2V_{2S}$$

The output pulses $P_o$ from the tertiary winding 7c of flyback transformer 7, in addition to being supplied to other circuits, are supplied to a pulse rectifier circuit 12. In the specific circuit embodiment of Fig. 8, this pulse rectifier circuit 12 consists of a voltage-doubling rectifier circuit formed of capacitors 26 to 27 and diodes 24 and 25. Designating the voltage difference between the peak value of the pulses $P_o$ produced from the tertiary winding 7c of flyback transformer 7 and the average value of pulses $P_o$ as $V_{1C}$, and designating the difference between the average value of pulses $P_o$ and the pedestal value of these pulses as $V_{2C}$, the output voltage $E_r$ from pulse rectifier circuit 12 is given as:

$$E_r = V_{1C} + V_{2C}$$

This DC voltage $E_r$ is applied to a comparator circuit 14 as a comparison voltage, while a reference voltage $E_s$ produced from a reference voltage source 13 is also supplied to comparator 14 for comparison with voltage $E_r$. The result of this comparison is a signal $E_o$ which represents the difference between voltages $E_r$ and $E_s$, and this signal $E_o$ is applied as a control signal to the voltage control circuit 15 (voltage regulator 15).

The reference voltage source 13 shown in FIG. 8 comprises a resistor 28 and a zener diode 29, and derives the reference voltage $E_s$ from a voltage $+E$ produced from a power source.

In the following, the output voltage from voltage control circuit 15, which constitutes a supply voltage for operation of the horizontal deflection circuit, will be designated as $E_b'$. The operation of the portion of the circuits shown in FIGS. 7 and 8 other than the parallel circuit formed by the saturable reactor 9 and the damping resistor 16, and the amplifier 10 with the variable resistor 11, will first be described. If the comparison voltage $E_r$ supplied to the comparator 14 is higher than the reference voltage $E_s$, then the control signal $E_o$ from comparator 14 will act on the voltage control circuit 15 such as to lower the level of output voltage $E_b'$ produced therefrom. It can thus be understood that a feedback control loop is configured which acts through a path extending from the primary winding 7a of flyback transformer 7, to the tertiary winding 7c, to the pulse rectifier circuit 12, to the comparator 14, to the voltage control circuit 15, and back to the primary winding 7a of flyback transformer 7. This feedback control loop functions such that any increase in the amplitude of the flyback pulses produced across the primary winding 7a, causing an increase in the amplitude of pulses $P_o$ from the tertiary winding 7c and hence in increase in voltage $E_r$, will result in a lowering of voltage $E_b'$ from voltage control circuit 15, and hence a reduction in the level of current flow through primary winding 7a and a consequent reduction of the amplitude of the pulses $P_o$ from tertiary winding 7c. In this way the feedback control loop acts to hold the amplitude of the pulses $P_o$ produced from the tertiary winding 7c of flyback transformer 7 at a constant value, and hence to hold the output voltage $E_r$ from the pulse rectifier circuit 12 at a constant value.

If the configuration of the rectifier circuit which constitutes the high-voltage DC generating circuit 8 is basically identical to that of the rectifier circuit used as pulse rectifier circuit 12, then the anode EHT DC voltage produced from high-voltage DC generating circuit 8 will also be held at a constant level. This is true for the circuit embodiment of FIG. 8, in which high-voltage DC generating circuit 8 and pulse rectifier circuit 12 are both of pulse voltage-multiplier configuration, based upon "diode pump" voltage step-up operation.

With the circuit embodiments of FIGS. 7 and 8, as stated above, if the comparison voltage $E_r$ supplied to the comparator 14 is higher than the reference voltage $E_s$, then the control signal $E_o$ from comparator 14 will act on the voltage control circuit 15 such as to lower the level of output voltage $E_b'$ which is produced from circuit 15. In this case, the collector pulses $P_c$ (which are generated at the collector of the horizontal output transistor 1) which be voltage-divided by the primary winding 7a of flyback transformer 7 and the controlled windings 9a and 9a' of saturable reactor 9 such that $P_c = P_1 + P_2$, where P1 denotes the amplitude of flyback pulses produced across the primary winding 7a and P2 denotes the amplitude of pulses produced across the series-connected controlled windings 9a and 9a' of saturable reactor 9. Thus, the pulses $P_o$ from tertiary winding 7c of flyback transformer 7 become reduced in amplitude, by comparison with the case in which the controlled windings 9a and 9a' of saturable reactor 9 are not connected in series with primary winding 7a of flyback transformer 7, with the degree of this amplitude reduction being proportional to the total inductance $L_s$ of windings 9a, 9a'.

As stated above, a feedback control loop is configured which acts through a path extending from the primary winding 7a of flyback transformer 7, to the tertiary winding 7c, to the pulse rectifier circuit 12, to the comparator 14, to the voltage control circuit 15, to the circuit formed by 9 of saturable reactor 9 connected in parallel with damping resistor 16, and back to the primary winding 7a of flyback transformer 7, whereby the amplitude of the pulses $P_o$ produced from the tertiary winding 7c of flyback transformer 7 and the output voltage $E_r$ from the pulse rectifier circuit 12 are respectively held at fixed values. As a result, a proportional relationship is established between the voltage $V_{1C}$ (i.e. the difference between the peak value of pulses $P_o$ produced from tertiary winding 7c of flyback transformer 7 and the average value of these pulses) and voltage $V_{1S}$ (i.e. the difference between the peak value of pulses $P_{os}$ produced from secondary winding 7b of flyback transformer 7 and the average value of these pulses). Furthermore, a proportional relationship is established between the voltage $V_{2C}$ (i.e. the difference between the average value of pulses $P_o$ produced from tertiary winding 7c of flyback transformer 7 and the pedestal value of these pulses) and voltage $V_{2S}$ (i.e. the difference between the average value of pulses $P_{os}$ produced from secondary winding 7b of flyback transformer 7 and the pedestal value of these pulses). Thus, if the output voltage $E_r$ from the pulse rectifier circuit 12 is held constant at a value $E_r = V_{1C} + V_{2C}$, then if a variation should occur in the ratio of $V_{2C}$ (i.e. the difference between the average value of pulses $P_o$ produced from tertiary winding 7c of flyback transformer 7 and the pedestal value of these pulses) to $V_{1C}$ (i.e. the difference between the peak value of pulses $P_o$ produced from tertiary winding 7c of flyback transformer 7 and the average value of these pulses), due for example to a frequency variation, the DC EHT voltage produced from high-voltage DC generating circuit 8 will be held constant at a value $E_{EHT} = 2(V_{1S} + V_{2S})$.

The current which flows in the horizontal deflection coil 4, i.e. the horizontal deflection current $I_y$, is expressed as $I_y = E_b' \cdot T_s L_y$. Thus the horizontal deflection current $I_y$ is increased in proportion to an increase in the actual operating DC voltage $E_b'$ of the horizontal deflection circuit, causing a corresponding increase in the horizontal sweep width. Thus, by increasing or reducing the inductance of controlled windings 9a and 9a' of saturable reactor 9, the ratio of the amplitude of pulses P1 produced across the primary winding 7a of flyback transformer 7 to the amplitude of pulses P2 produced across controlled windings 9a and 9a' of saturable reactor 9 is can be correspondingly changed, so that the value of the horizontal deflection current $I_y$ (and hence the horizontal sweep width) can be freely adjusted.

If inductance is directly connected in series with the primary winding 7a of flyback transformer 7, as in the present embodiment, then it is possible that a ringing component may be generated at a higher frequency than the basic frequency of the flyback pulses. Such a ringing component may affect the high-order harmonic tuning operation of the flyback transformer, and hence such components are eliminated by the damping resistor 16 which is connected in parallel with controlled windings 9a and 9a' of flyback transformer 9.

In the circuit arrangement of FIG. 8, the comparison voltage $E_r$ which is output from the pulse rectifier circuit 12 is applied to the non-inverting input terminal of comparator 14, while the reference voltage $E_s$ produced from reference voltage source 13 is applied to the inverting input terminal of comparator 14, to thereby produce a comparison output from comparator 14 (i.e. signal $E_o$ which represents the difference between inputs $E_r$ and $E_s$). This signal $E_o$ is utilized as a control signal for voltage control circuit 15 (i.e. voltage regulator 15).

In the specific circuit embodiment of FIG. 8, the voltage control circuit 15 includes transistors 31 and 33 and resistors 30, 32 and 34, and capacitor 35. The control signal $E_o$ is applied from comparator 14 through a base resistor 30 to the base of transistor 31 in voltage control circuit 15. The collector output signal from transistor 31 is supplied through a resistor 32 to the base of transistor 32. Resistor 34 is a base bias resistor, while capacitor 35 performs smoothing of the output voltage $E_b'$.

The operation of voltage control circuit 15 is as follows. If the comparison voltage $E_r$ which is applied to comparator 14 should for example rise above the reference voltage $E_s$, then the control signal $E_o$ produced by comparator 14 will be increased. As a result, the collector current of transistor 31 will be increased, whereby the base current supplied to transistor 33 will be reduced. Thus, the emitter voltage $E_b'$ of transistor 33 will be reduced, i.e. the value of supply voltage $E_b'0$ will be reduced, causing a reduction in the horizontal deflection current $I_y$. As a result, voltage control circuit 15 acts to hold the amplitude of pulses $P_o$ produced from tertiary winding 7c of flyback transformer 7 at a constant value.

To reduce the horizontal sweep width, a potentiometer 11 coupled to amplifier circuit 10 (described hereinafter) is adjusted such as to produce an increase in the DC current flow through control winding 9b of saturable reactor 9, to thereby reduce the total inductance $L_s$ of controlled windings 9a and 9a'. As stated above, the collector pulses $P_c$ produced by horizontal output transistor 1 are voltage-divided between the controlled windings 9a and 9a' and the primary winding 7a of flyback transformer 7. Although the reduction of the inductance of controlled windings 9a, 9a' will tend to increase the amplitude of flyback pulses P1 produced across the primary winding 7a of flyback transformer 7 (i.e the pulses produced by voltage division of the the collector pulses $P_c$ produced by horizontal output transistor 1 between the controlled windings 9a and 9a' and the primary winding 7a of flyback transformer 7), the output voltage $E_b'$ from voltage control circuit 15 will be accordingly reduced by the action of the feedback control loop described above, extending from the primary winding 7a of flyback transformer 7, to the tertiary winding 7c etc and back to primary winding 7a. Due to this lowering of voltage $E_b'$, the horizontal deflection current $I_y$ will be reduced, causing the desired reduction of the horizontal sweep width.

Referring to FIG. 8, one end of the control winding 9b of saturable reactor 9, which controls the inductance value of the controlled windings 9a and 9a' is connected to a power source potential E, while the other end is connected to the collector of transistor 39 of amplifier 10. The amplifier 10 also includes a PNP transistor 37 and resistors 38 and 40, in addition to NPN transistor 39. The base of PNP transistor 37 is connected to the slider terminal of horizontal sweep width adjustment potentiometer 11, while the resistance element of potentiometer 11 is connected between the power source potential E and ground potential.

The voltage Ew which appears at the slider terminal of the horizontal sweep width adjustment potentiometer 11 is almost identical to the emitter voltage Ee of the NPN transistor 39 in amplifier 10. Designating the resistance value of emitter resistor 40 of NPN transistor 39 as R, and the current which flows in resistor 40 as Ie, then the following relationships are true:

$$Ie = Ee/R \approx Ew/R$$

Thus, Ie is determined by the voltage Ew which appears at the slider terminal of potentiometer 11. The value of this current Ie is almost identical to the collector current of NPN transistor 39, which flows through the control winding of saturable reactor 9. Thus, by adjusting the position of the slider of potentiometer 11, the value of current which flows in the control winding can be adjusted as required, to thereby vary the inductance of controlled windings 9a and 9a' of saturable reactor 9 as shown in FIG. 5. In this way, the actual power supply voltage $E_b'$ which is applied to the horizontal deflection circuit can be varied as described above such as to continuously vary the horizontal deflection circuit $I_y$ and hence to continuously vary the horizontal sweep width, while maintaining the level of the DC EHT voltage from DC high voltage generating circuit 8 and the amplitude of pulses $P_o$ from tertiary winding 7c of flyback transformer 7 at respective constant values.

In the embodiment described above, a sawtooth current waveform flows through the controlled windings 9a and 9a' of saturable reactor 9 and through the primary winding 7a of flyback transformer 7. Even if this current waveform is distorted as a result of variation of inductance L (i.e. the sum of the inductance values deflection coil 4, the flyback transformer 7 as viewed from primary winding 7a, and controlled windings 9a and 9a') due to the flow of current through these coils and windings, this will have no effect upon the horizontal deflection current $I_y$. Thus, the problem described hereinabove with reference to FIG. 6 will not occur with the present invention.

The voltage control circuit 15 in the embodiment of FIG. 8 employs a class A transistor amplifier circuit. However it would be equally possible to employ a switching type of regulator, or various other forms of circuit configuration, to implement this voltage control circuit.

The present invention, as described hereinabove, provides a horizontal deflection circuit which enables the horizontal sweep width of a CRT raster to be freely adjusted, while maintaining the peak amplitude of output pulses from the flyback transformer (and hence the CRT anode EHT voltage level) at constant values. In addition, adjustment of the horizontal sweep width can be carried out without producing distortion of images displayed on the CRT. Since the peak amplitude of pulses which are generated from the tertiary winding of the flyback transformer do not vary in response to variations in the inductance of the controlled windings of the saturable reactor, if pulses produced from a tertiary winding or other output winding of the flyback transformer are utilized by other circuits within the television receiver, no problems will arise such as variation of a supply voltage generated by rectifying such pulses, when the horizontal sweep width is adjusted. This is a problem which arises with prior art types of horizontal deflection circuit, as described hereinabove. It can thus be understood that the present invention effectively overcomes various problems which have arisen in the prior art.

Although the present invention has been described in the above with reference to specific embodiments, it should be noted that various changes and modifications to the embodiments may be envisaged, which fall within the scope claimed for the invention as set out in the appended claims. The above specification should therefore be interpreted in a descriptive and not in a limiting sense.

What is claimed is:

1. A horizontal deflection circuit for producing horizontal sweep operation of a cathode ray tube, comprising:
    a horizontal deflection coil, and a periodically actuated switching element coupled thereto;
    a flyback transformer having a primary winding, a secondary winding for producing high voltage pulses in response to generation of pulses in said primary winding, and a tertiary winding for producing output pulses in response to generation of pulses in said primary winding, one end of said primary winding being coupled to said horizontal deflection coil;
    voltage control circuit means for producing a supply voltage at a controllable level;
    externally adjustable inductance means, comprising a saturable reactor, coupled between said voltage control circuit means and the other end of said primary winding of said flyback transformer, and;
    means for producing a control signal based upon an amplitude of said pulses generated from said tertiary winding, said control signal being applied to said voltage control circuit means for controlling the level of said supply voltage.

2. A horizontal deflection circuit for producing horizontal sweep operation of a cathode ray tube, comprising;
    a horizontal deflection coil, and a periodically actuated switching element coupled thereto;
    a flyback transformer having a primary winding, a secondary winding and a tertiary winding, one end of said primary winding being coupled to said horizontal deflection coil;
    a saturable reactor having a control winding and a controlled winding, one end of said controlled winding being connected to the other end of said primary winding of said flyback transformer;
    voltage control circuit means coupled to the other end of said controlled winding for applying a supply voltage thereto to produce a flow of current through said primary winding and said horizontal deflection coil, the current flow being periodically switched by said switching element, pulses being thereby generated across said primary winding, pulses being thereby generated from said secondary and tertiary windings with the secondary winding pulses being of stepped-up amplitude, for use in producing an anode voltage of said cathode ray tube;
    means for producing a flow of DC current through said control winding of said saturable reactor, operable for adjusting the level of said DC current flow to thereby vary the inductance of said controlled winding of said saturable reactor, and;
    feedback control means for controlling said supply voltage produced from said voltage control circuit means based upon the ampliude of said pulses generated from said tertiary winding, said control being executed such as to maintain said pulse amplitude at a predetermined value.

3. A horizontal deflection circuit according to claim 2, in which said feedback control means comprises:
    a pulse rectifier circuit for converting said pulses generated from said tertiary winding of said flyback transformer to a DC comparison voltage;
    a source of a fixed reference voltage, and;
    comparator means for comparing said comparison voltage with said reference voltage and for producing a control signal in accordance with a difference between said comparison voltage and reference voltage;
    said control signal being applied to said voltage control circuit means for controlling said supply voltage produced therefrom such as to reduce said difference.

4. A horizontal deflection circuit according to claim 2, in which said pulse rectifier circuit comprises a pulse voltage step-up circuit formed of a combination of diode and capacitor elements.

5. In a horizontal deflection circuit for a cathode ray tube, including a flyback transformer, said transformer having primary, secondary and tertiary windings, and a horizontal deflection coil, the improvement comprising:
    adjusting means for adjusting horizontal sweep width while maintaining substantially constant an amplitude of high voltage output pulses from said transformer, including:
    a feedback control loop including said primary and tertiary windings of said transformer, and
    control means for providing a voltage to operate said horizontal deflection circuit and for determining a current for said horizontal deflection coil,
    said control means included in said feedback control loop and connected in series with said primary winding of said flyback transformer,
    said control means comprising:
        a controlled winding of a saturable reactor means for adjusting a value of the horizontal deflection coil current and
        a voltage control current circuit operable in said feedback control loop to maintain constant a magnitude of pulses produced by said tertiary winding, said voltage control circuit providing a substantially constant voltage level to said controlled winding.

6. An improved horizontal deflection circuit as recited in claim 5 further comprising current control means for controlling current in a control winding of said saturable reactor means thereby to vary the inductance of said controlled winding thereof and thus to vary horizontal sweep width.

7. An improved horizontal deflection circuit as recited in claim 5 further comprising a damping resistor means connected across said controlled winding of said saturable reactor means for eliminating ringing.

8. An improved horizontal deflection circuit as recited in claim 5 wherein said feedback control loop further includes
pulse rectifying means and
comparing means,
said pulse rectifying means receiving output pulses from said tertiary winding and providing a rectified output voltage to said comparing means for comparison with a reference voltage level, said comparing means providing an output indicative of a result of comparison of said rectified output voltage and said reference voltage level, said output provided as an input control voltage to said voltage control means for controlling the voltage supplied to said horizontal deflection circuit,
thereby to maintain substantially constant said amplitude of high voltage output pulses from said transformer.

9. An improved horizontal deflection circuit as recited in claim 5 wherein said feedback control loop further includes
pulse rectifying means and
comparing means,
said pulse rectifying means receiving output pulses from said tertiary winding and providing a rectified output voltage to said comparing means for comparison with a reference voltage level, said comparing means providing an output indicative of a result of comparison of said rectifier output voltage and said reference voltage level, said output provided as an input control voltage to said voltage control means for controlling the voltage supplied to said horizontal deflection circuit,
thereby to maintain substantially constant said amplitude of high voltage output pulses from said transformer.

10. In a horizontal deflection circuit for a cathode ray tube, including a flyback transformer, said transformer having primary, secondary and tertiary windings, and a horizontal deflection coil, the improvement comprising:
adjusting means for adjusting horizontal sweep width while maintaining substantially constant an amplitude of high voltage output pulses from said transformer, including:
a feedback control loop including said primary and tertiary windings of said transformer, and
control means for providing a voltage to operate said horizontal deflection circuit and for determining a current for said horizontal deflection coil,
said control means included in said feedback control loop and connected in series with said primary winding of said flyback transformer,
said control means comprising inductance varying means for varying an inductance of a controlled winding of a saturable reactor in series with said primary winding of said flyback transformer thus to vary horizontal sweep width.

11. An improved horizontal deflection circuit as recited in claim 10 wherein said controlled winding of said saturable reactor transfers a DC voltage from said control means to said horizontal deflection coil for controlling said horizontal sweep current.

* * * * *